US006370255B1

(12) United States Patent
Schaub et al.

(10) Patent No.: US 6,370,255 B1
(45) Date of Patent: Apr. 9, 2002

(54) LOUDNESS-CONTROLLED PROCESSING OF ACOUSTIC SIGNALS

(75) Inventors: Artur Schaub, Wolfhausen; Remo Leber, Bubikon, both of (CH)

(73) Assignee: Bernafon AG (CH)

(*) Notice: Subject to any disclaimer, the term of this patent is extended or adjusted under 35 U.S.C. 154(b) by 0 days.

(21) Appl. No.: 08/896,325

(22) Filed: Jul. 17, 1997

(30) Foreign Application Priority Data

Jul. 19, 1996 (CH) .............................................. 1823/96

(51) Int. Cl.[7] .......................... H03G 3/00; H04R 25/00

(52) U.S. Cl. ........................ 381/107; 381/312; 381/104

(58) Field of Search ................................ 381/312, 321, 381/56, 104, 106, 107, 320

(56) References Cited

U.S. PATENT DOCUMENTS 5,475,759 A * 12/1995 Engebretson ............... 381/312
5,495,534 A * 2/1996 Inanaga et al. ............... 381/74
5,687,241 A * 11/1997 Ludvigsen .................. 381/312
5,771,299 A * 6/1998 Melanson ................... 381/312
5,892,836 A * 4/1999 Ishige et al. ................ 381/320

* cited by examiner

*Primary Examiner*—Forester W. Isen
*Assistant Examiner*—Brian Pendleton
(74) *Attorney, Agent, or Firm*—Milton Oliver; Ware, Fressola, Van der Sluys & Adolphson LLP

(57) ABSTRACT

With the method acoustic signals, e.g. in hearing aids, are processed in loudness-controlled manner in such a way that the loudness subjectively received by the hearing impaired person again always corresponds to the loudness received by listeners with normal hearing. Signal processing takes place without Fourier transformation and without subdivision of the signal into subband signals in iterative manner and completely in the time domain. This eliminates the disadvantage of unacceptably long signal delay times of known methods and permits a practical use. The apparatus for performing the method contains a processing stage (4) for the iterative calculation of a loudness-characteristic control quantity ($\psi$) and a correcting filter stage (7) controlled in time-dependent manner therewith. Compared with known methods, the inventive method requires only drastically reduced processing resources, which can mainly be attributed to the particularly efficient and unconventional implementation of the processing stages.

29 Claims, 11 Drawing Sheets

LOUDNESS-CONTROLLED PROCESSING OF ACOUSTIC SIGNALS

Figure 1:
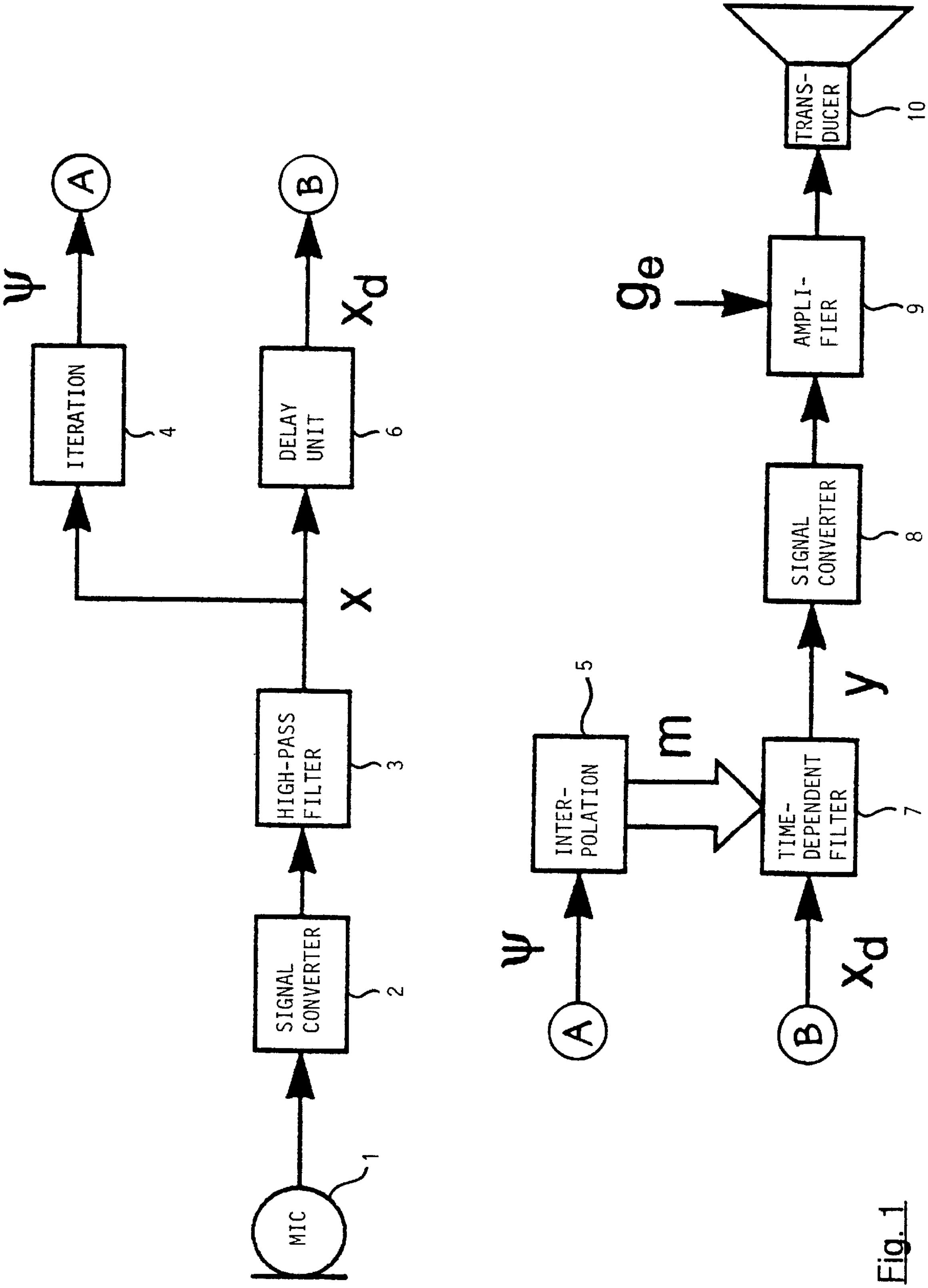

The invention relates to a method for the loudness-controlled processing of acoustic signals in acoustic processing equipment, as well as to an apparatus for performing the method according to the preambles of the independent claims. The invention is particularly suitable for use in hearing aids for hearing impaired persons. Entering acoustic signals are processed in such a way that the loudness subjectively received by the hearing impaired person always corresponds to the loudness received by persons with normal hearing.

The idea of loudness-controlled processing of acoustic signals has long been known and has been described by numerous authors, e.g. by N. Dillier et al. in "Journal of Rehabilitation Research and Development", vol. 30, No. 1, 1993, pp 100–103. The method is based on the fact persons with normal hearing and with impaired hearing are provided with test signals for evaluating the subjectively received loudness. Harmonic sinusoidal signals or narrow-band noise are used as test signals. The subjectively received loudness is dependent on the signal power and the frequency of a sinusoidal signal, or the frequency of the dominant signal components of a complex signal. The subjective loudness details are determined on a normalized or standard scale with the value range [0, 1]. By comparing the details from a hearing impaired person with those of a reference group of listeners with normal hearing, it is possible to determine hearing impaired-specific, loudness-dependent correcting data. In a matching signal processing method these correcting data are used in order to process for the hearing impaired person the acoustic signals of his environment in the aimed manner. Remarkable intelligibilty improvements were proved in the aforementioned article in the case of intelligibility tests with a group of 13 hearing impaired persons.

Despite the audiological action, the loudness-controlled processing cannot be used in practice in the form known up to now. As described in the aforementioned article, processing takes place by Fourier transformation of short signal segments, the modification of short-time spectra and retransformation of the modified short-time spectra into the time domain. As a result of the segmentwise processing there is a delay of almost 20 ms for the processed signal. This delay is unimportant in intelligibility tests. However, in practice if the hearing impaired person also speaks and perceives his own voice with such a delay, this is completely unacceptable. In the method described in said article the duration of the individual segments is 12.8 ms and it is also possible to drop significantly below this value, because for obtaining a usable short-time spectrum a minimum segment duration of this order of magnitude is vital.

As an alternative to segmentwise processing the starting point was used of subdividing the acoustic signal into subband signals and to process the individual subband signals with separate amplification or gain values. It is known from practical tests that on subdividing into up to three subband signals improvements can be obtained. A subdivision into more subband signals leads to inferior results. A possible reason for this is the discontinuities of the transfer function occurring at the subband boundaries. On comparing the subdivision of the signal into three subband signals with the frequency resolution of short-time spectra of segmentwise processing, it is clear that the potential of the latter cannot be exhausted with the alternative starting point. Even if with the subdivision into more subband signals ways to obtain improved results were found, this would once again lead to the problem of significantly increasing signal delay.

Another aspect for a successful loudness-controlled signal processing is associated with the loudness model used in processing. Unlike simple test signals, the signal power of speech, music and noise is subdivided in time-dependent, complex manner over a wide frequency interval. With a loudness model with said complex signals is associated in time-dependent manner a loudness value, which in the ideal case exactly coincides with the loudness received by listeners with normal hearing. The value determined with the loudness model is used for the time-dependent control of signal processing. The loudness model described in the aforementioned article, apart from the total energy of a signal segment, also takes account of the centre of the short-time spectrum. For calculating the centre of the short-time spectrum use is made of the E. Zwicker bases summarized on pp 153 to 160 of his text book Psychoacoustics, Springer Publishing, Berlin-Heidelbreg-New York, 1990, 1999. From the spectral lines of the short-time spectrum, in a first stage the energies E(z) of the individual frequency groups are formed and then in analogy to the calculation of the centre of gravity in mechanics calculation takes place on the Bark scale z to a centre of the short-time spectrum $$c=\Sigma Z \cdot E(z)/\Sigma E(z) \tag{1}$$

If it was wished to implement this loudness model by subdividing the signal into subband signals, then for processing a band width of 7700 Hz in all it would be necessary to form 21 subband signals of different band width corresponding to the known frequency group width. Besides the aforementioned, sharply rising signal delay, this procedure would require extremely great arithmetical resources. With the presently available technologies for integrated circuits, as for the starting point with segmentwise processing, the transformation into a hearing aid with the existing geometrical dimensions and power consumption is excluded.

SUMMARY OF THE INVENTION

The object of the present invention is to provide a method for the loudness-controlled processing of acoustic signals in acoustic processing devices, which can in particular be used in hearing aids. The loudness subjectively received by the hearing aid user should always correspond to the loudness received by a person with normal hearing. In particular the signal delay must be so small that a hearing aid user is not irritated by the delayed perception of his own voice when speaking. There must also be a reduction in the arithmetical resources compared with known methods for the loudness-controlled processing of acoustic signals. In addition, an apparatus for performing the method according to the invention is to be provided.

In the method according to the invention, the processing of the acoustic signal takes place without Fourier transformation, i.e. completely in the time domain and also without subdivision into subband signals. The special nature of the inventive method is that a control quantity x characteristic of the loudness is iteratively calculated and used for controlling a time-dependent correcting filter. The term "iterative calculation procedure" means that a new value is calculated for each sampling time for the control quantity x using values having the quantities necessary for their calculation in the respectively preceding sampling time. Unlike in the known segmentwise procedure, the loudness-specific control quantity is not only determined as a mean value of successive signal segments, but instead as a continuous time function. The short signal delay of typically 2 ms represents the observation time necessary for a reliable estimated value formation over and beyond the validity time and therefore, unlike in the segmentwise procedure, is not merely the consequence of a disadvantageous characteristic of the selective implementation. The iterative calculation procedure takes place in the inventive method by means of particularly efficient and at the same time original method steps.

The time-dependent correcting filter is controlled in that to the parameters of said filter, new values are allocated at each sampling time by interpolation with the aid of the control quantity x. Unlike in the segmentwise procedure, where the hearing impaired-specific correcting data are stored as amplification values for the individual spectral lines of a short-time spectrum, in the inventive method for well defined values of the control quantity x coefficient sets for prototype filters are predetermined and stored. The transfer functions of these prototype filters pass along the corresponding amplification values, which are determined in the segmentwise method for the individual spectral lines of a short-time spectrum. In the method according to the invention, for characterizing the prototype filters use is made of coefficient sets, whereof it is known that they are suitable for an interpolation, i.e. that the transfer function determined by the interpolated coefficients, in accordance with expectations, passes between the transfer functions, which are determined by the coefficient sets on which the interpolation is based.

Thus, completely new ways are taken by the method according to the invention. The good intelligibility results described in the N. Dillier article are obtained. However, the inventive method also reduces the signal delay to about 2 ms and at the same time drastically reduces the arithmetical resources. It is therefore possible to implement the method according to the invention into a hearing aid of existing construction.

The invention also relates to an apparatus for performing the method according to the invention. This apparatus contains a stage for the iterative calculation of the loudness-characteristic control quantity x and a correcting filter stage controlled in time-dependent manner therewith, which in aimed manner processes incoming acoustic signals. There are various reasons for the aforementioned drastic reduction in the necessary processing resources. Firstly, in the iterative calculation procedure there is no need for the segmentwise buffer storage of the input and output signal. In addition, on storing coefficient sets for the prototype filters, there is also a significant saving compared with the storing of amplification values for the individual spectral lines of the short-time spectra.

The invention is described in greater detail hereinafter relative to an embodiment and the attached drawings, wherein show:

FIG. 1 A block diagram of the loudness-controlled processing.

Figure 2:
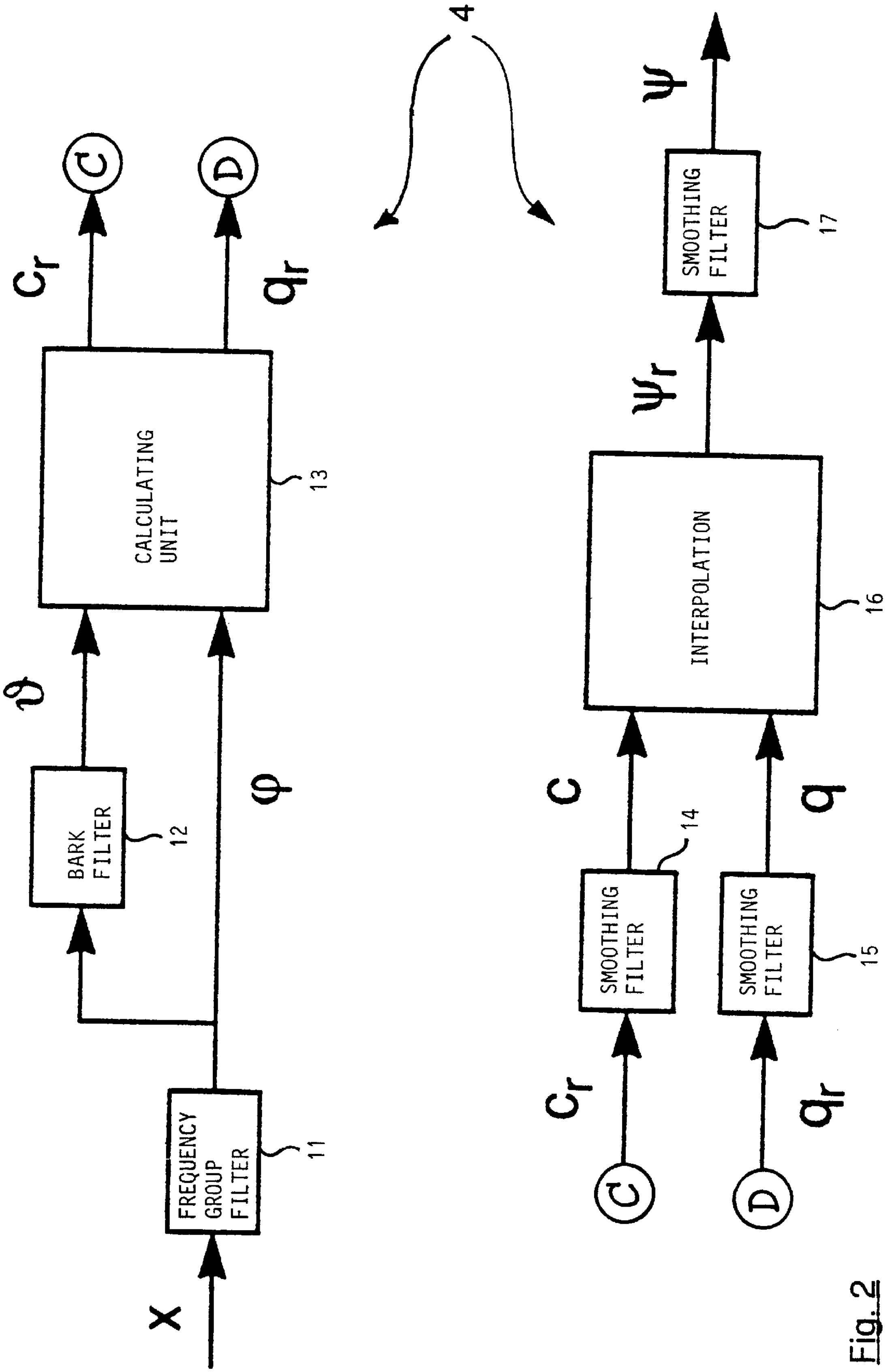

FIG. 2 A block diagram for determining the control quantity characteristic for the loudness.

Figure 3:
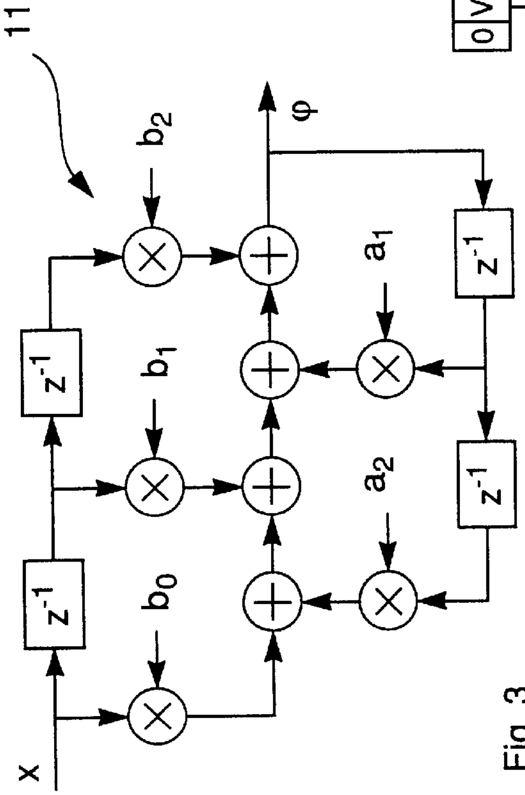

FIG. 3 A signal flow diagram of a recursive digital filter.

Figure 4:
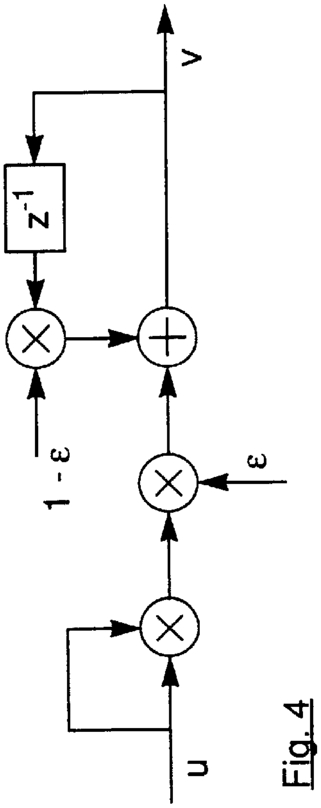

FIG. 4 A signal flow diagram of a simple estimated value calculating unit.

Figure 5:
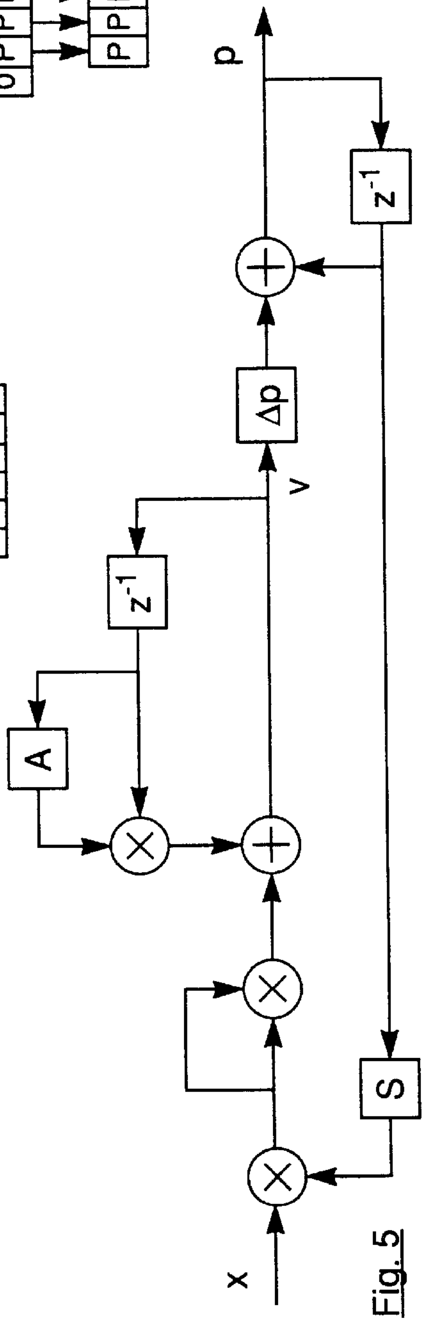

FIG. 5 A signal flow diagram of an estimated value calculating unit for the signal power.

Figure 6:
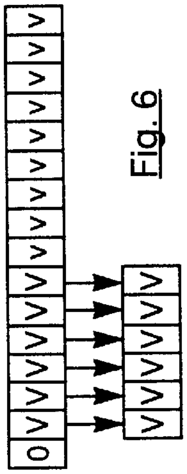
Figure 7:
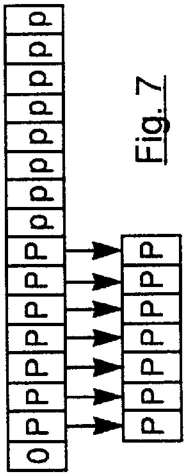

FIGS. 6 & 7 Diagrams for obtaining table addresses.

Figure 8:
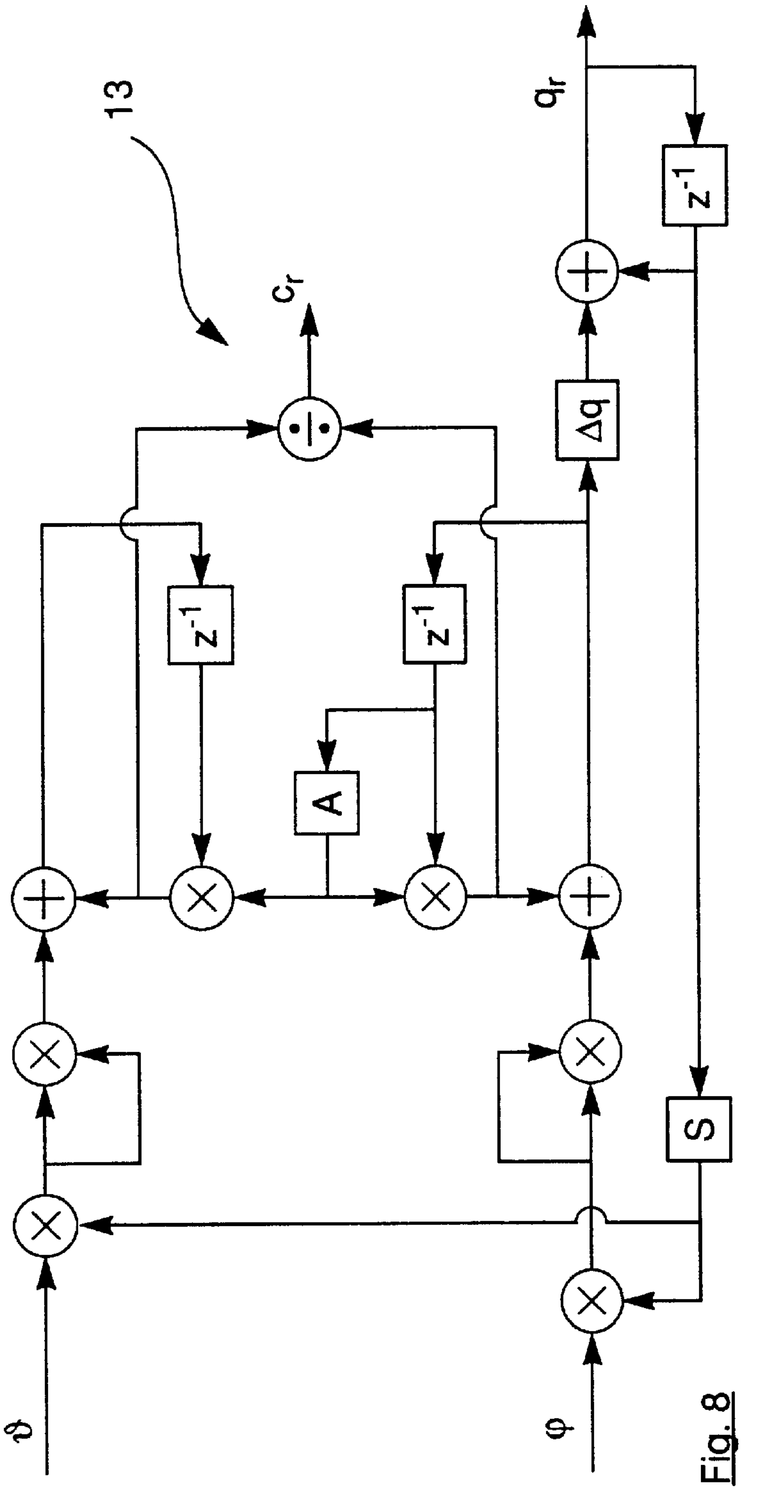

FIG. 8 A signal flow diagram of an estimated value calculating unit for the centre of the short-time spectrum.

Figure 9:
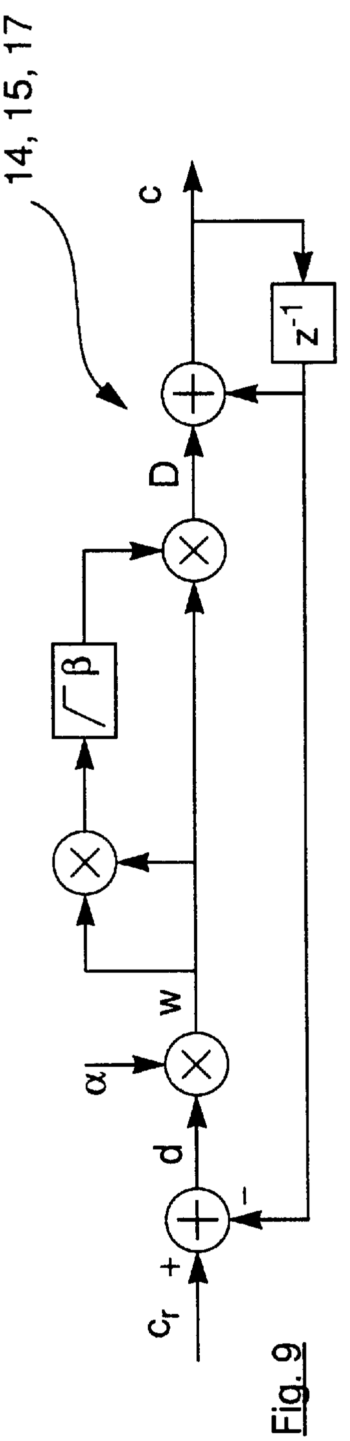

FIG. 9 A signal flow diagram of a nonlinear smoothing filter.

Figure 10:
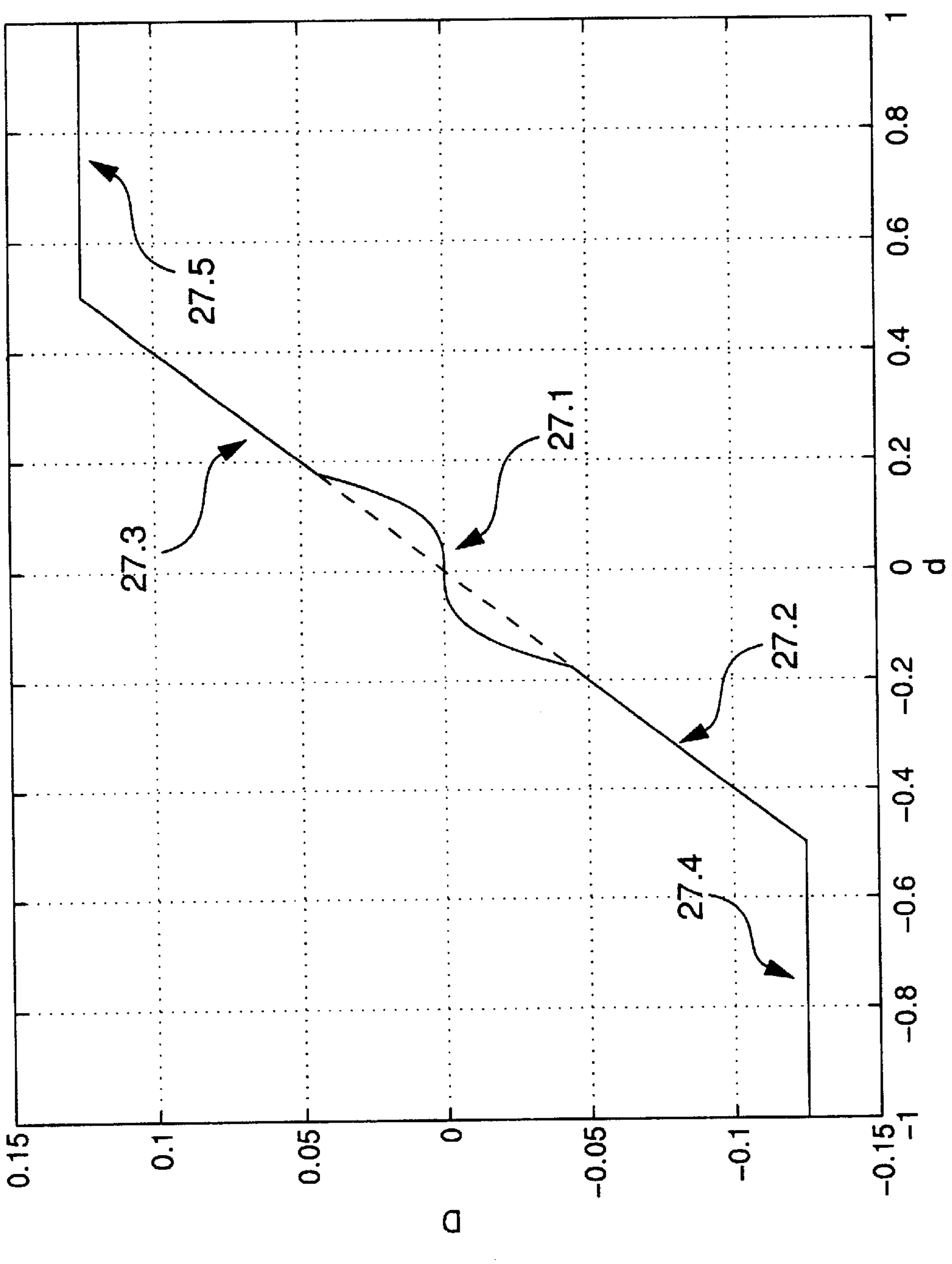

FIG. 10 A diagram for the connection between the internal quantities of a nonlinear smoothing filter.

Figure 11:
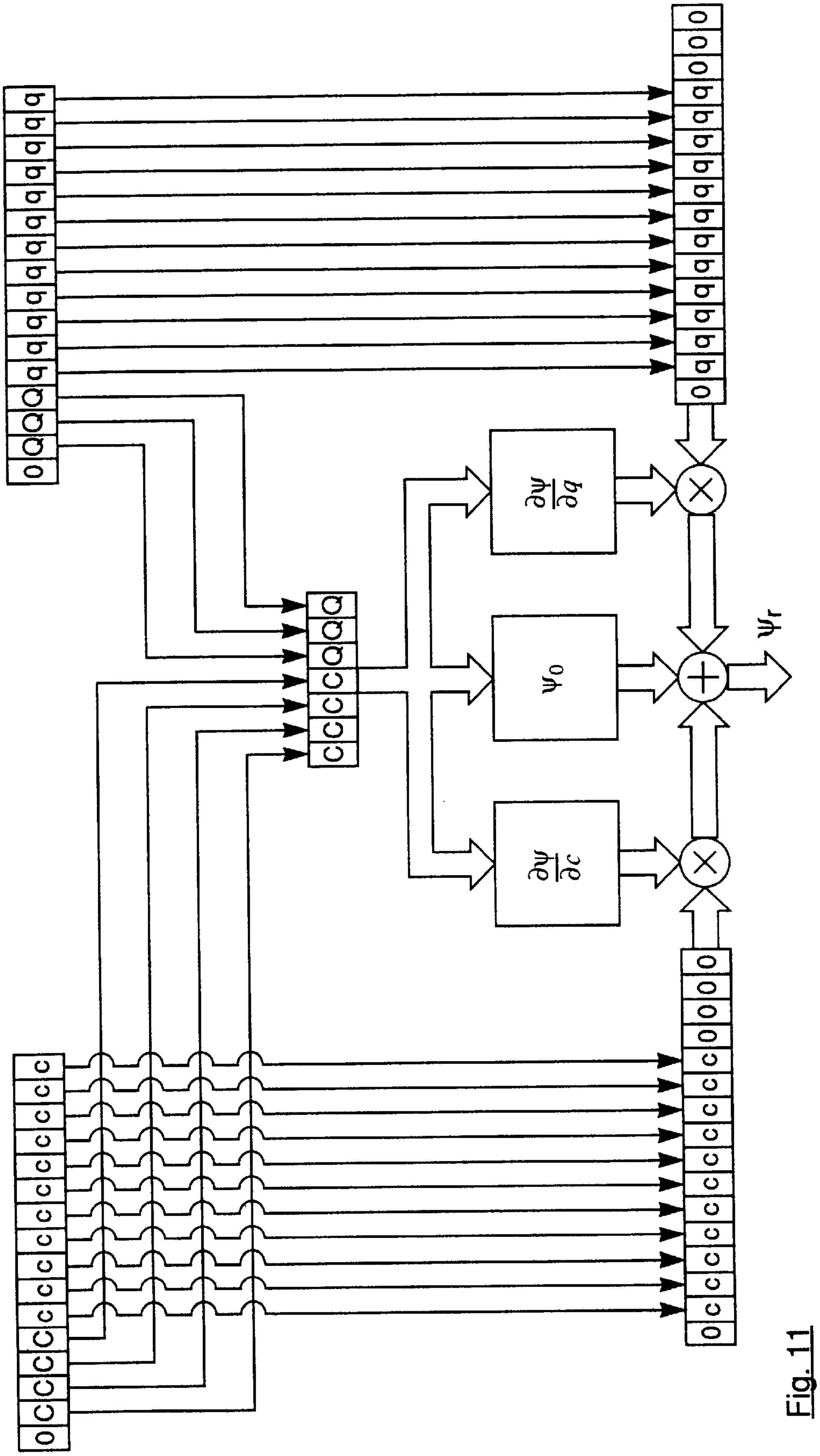

FIG. 11 A diagram for a bidimensional interpolation.

Figure 12:
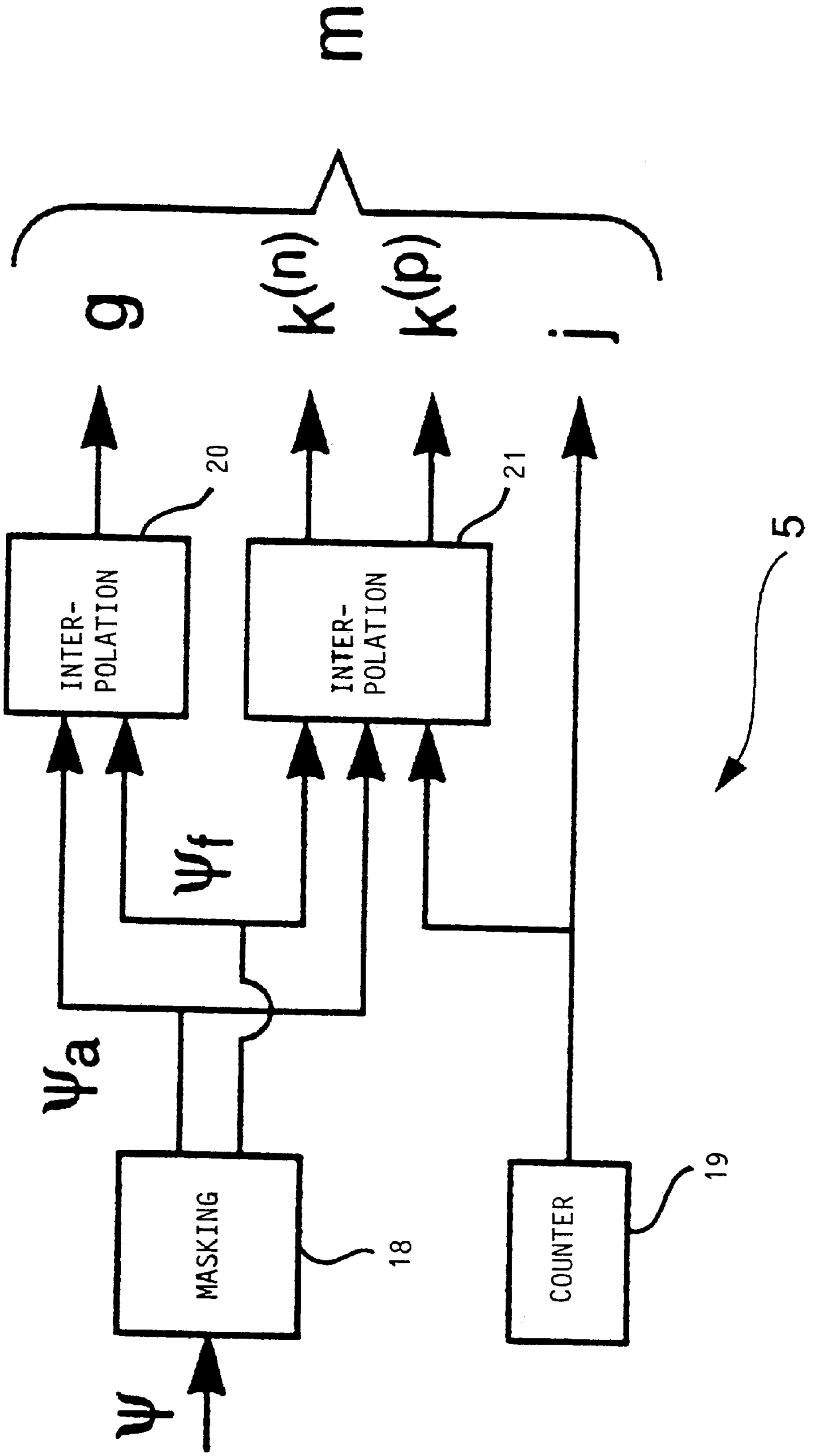

FIG. 12 A block diagram of the interpolation of parameters of the correcting filter.

Figure 13:
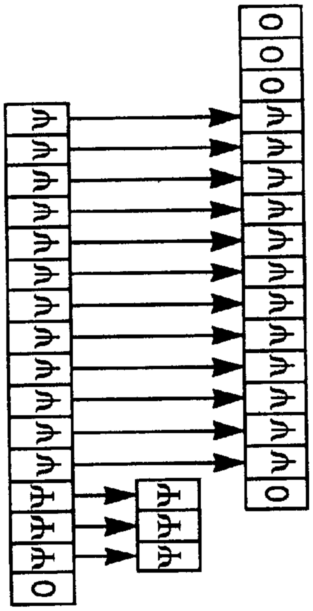

FIG. 13 A diagram for obtaining table addresses and proportional quantities for interpolations.

Figure 14:
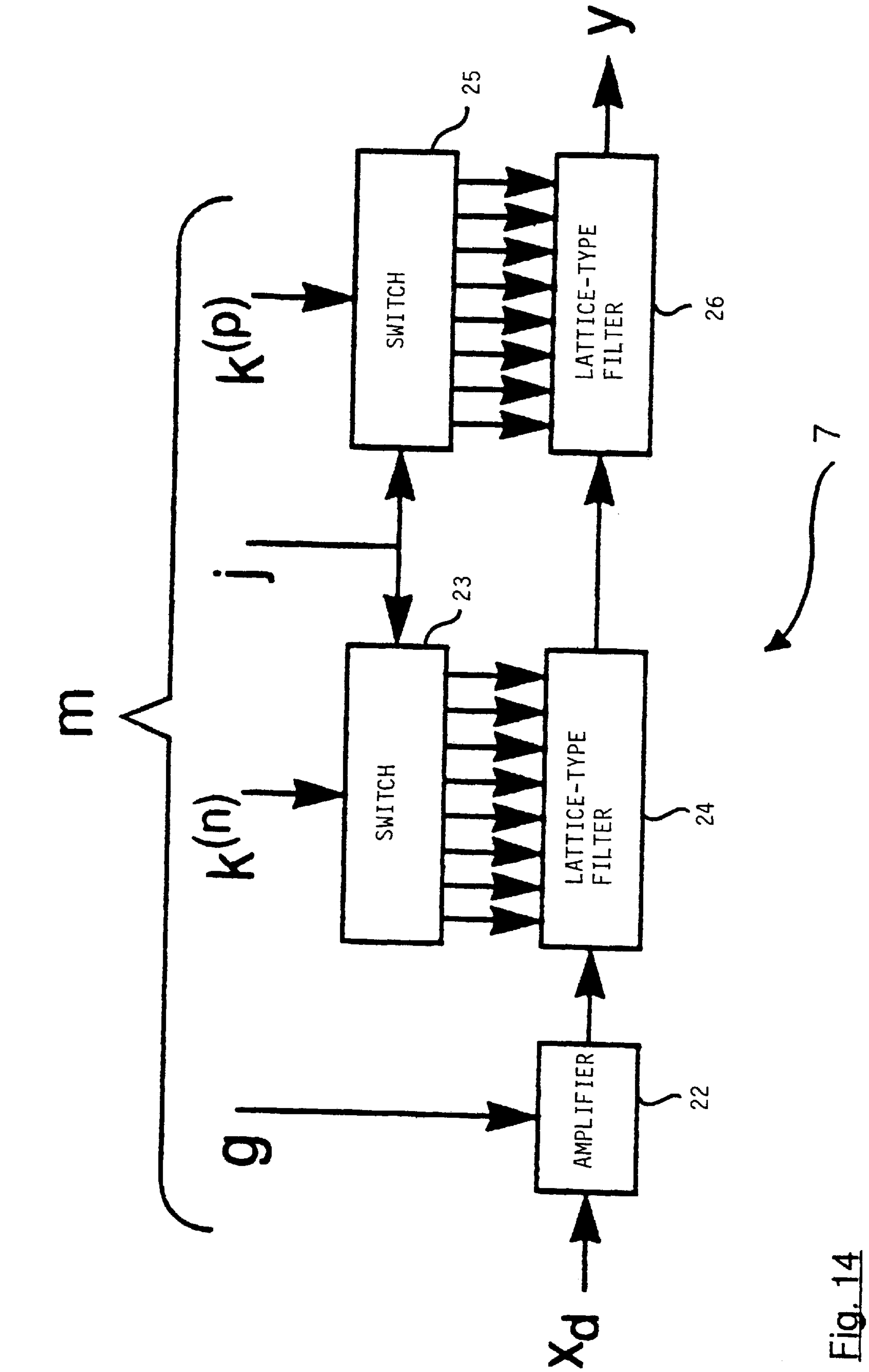

FIG. 14 A block diagram of the time-dependent correcting filter.

Figure 15:
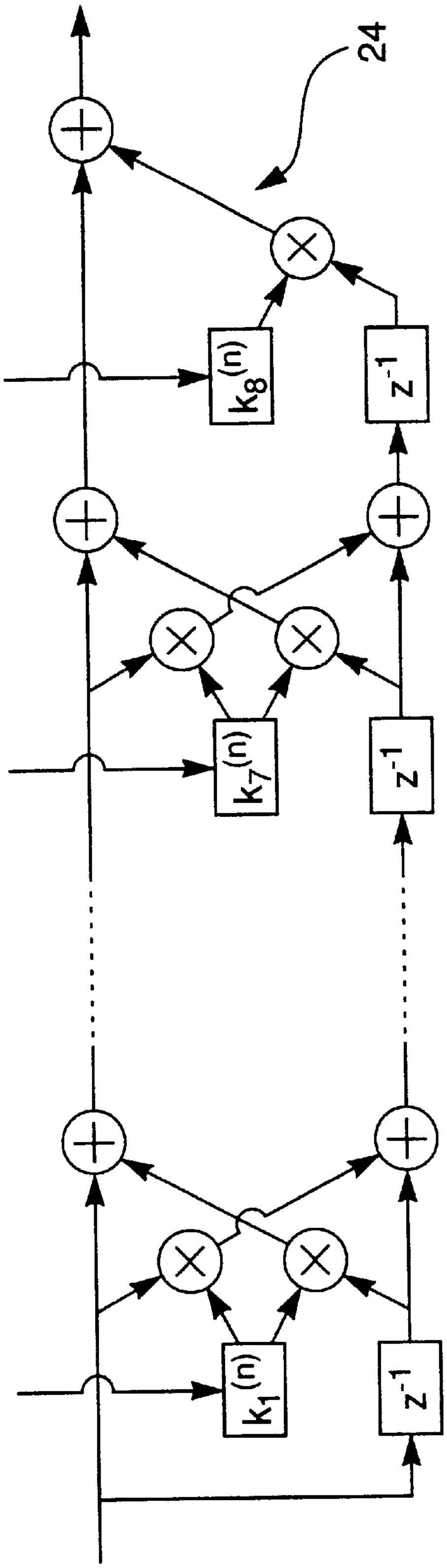

FIG. 15 A signal flow diagram of a lattice-type filter for zero implementation.

Figure 16:
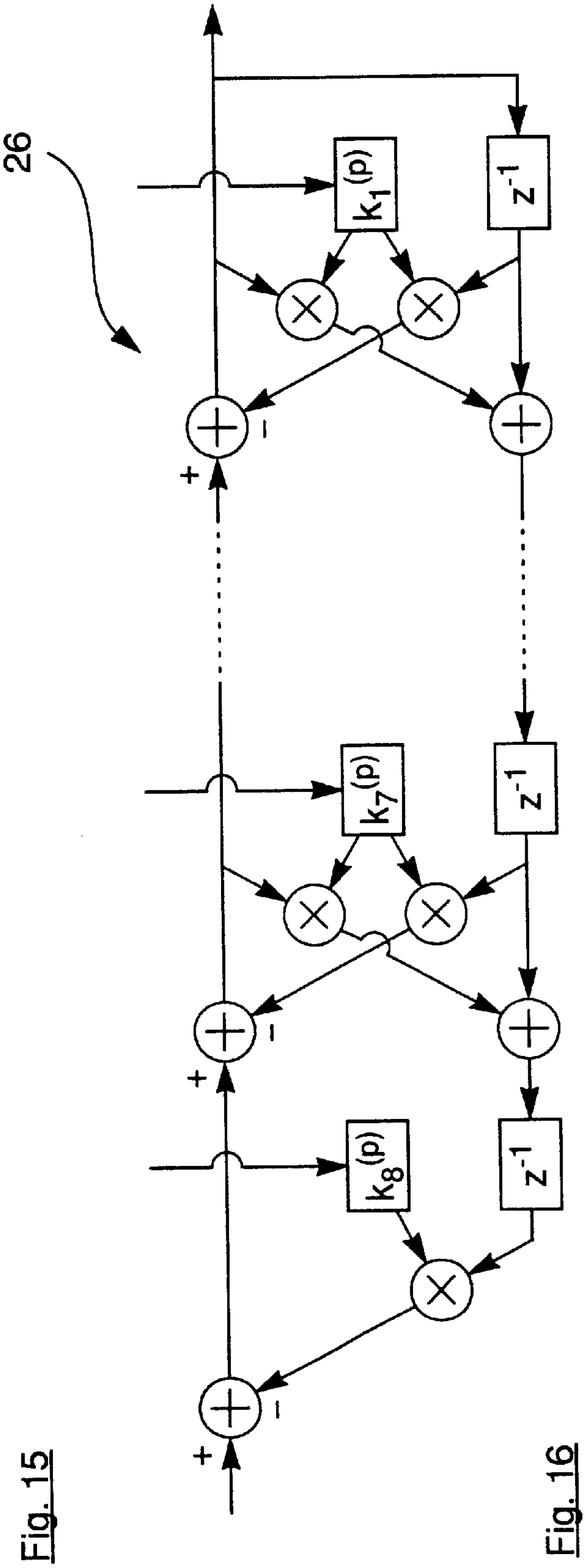

FIG. 16 A signal flow diagram of a lattice-type filter for pole implementation.

Figure 18:
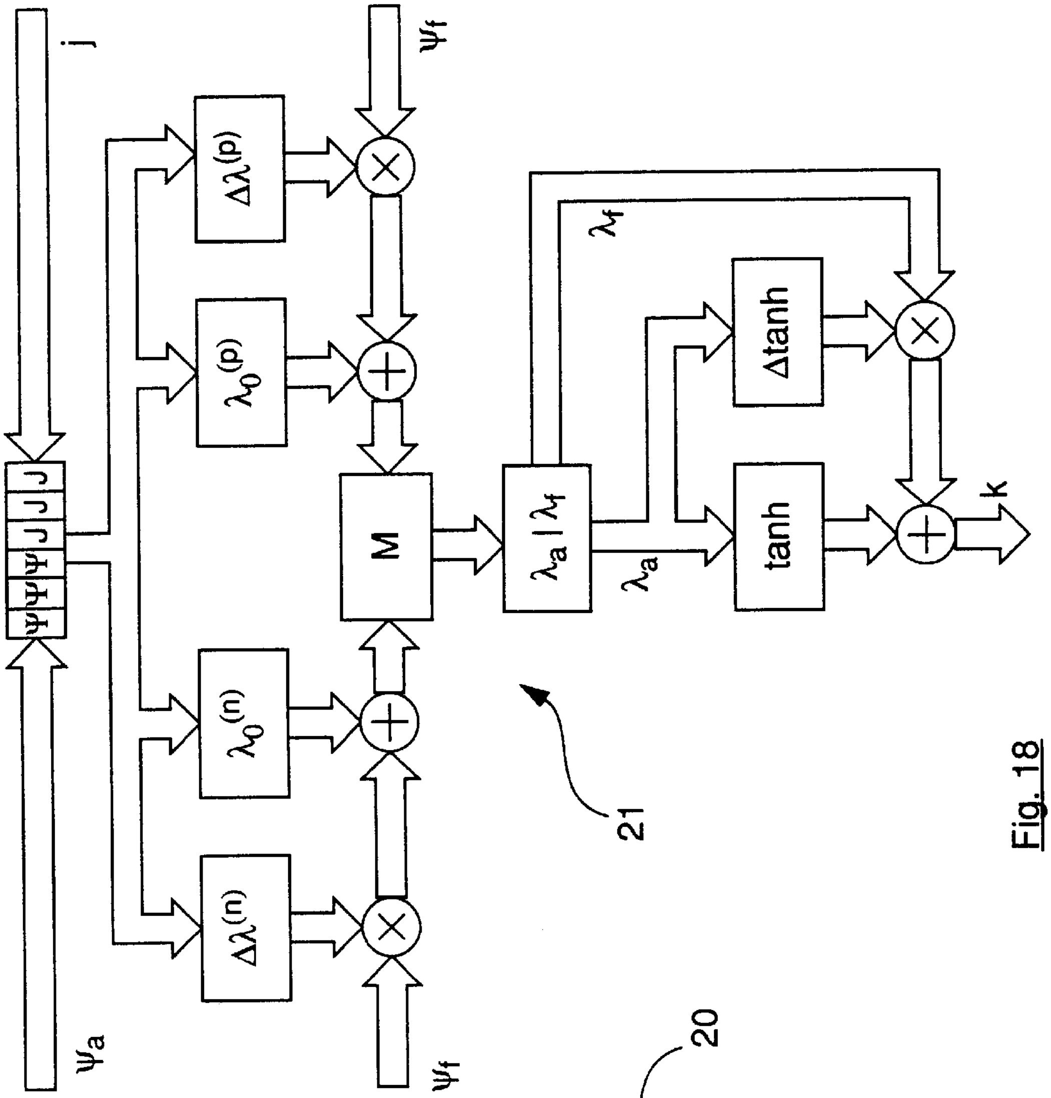
Figure 17:
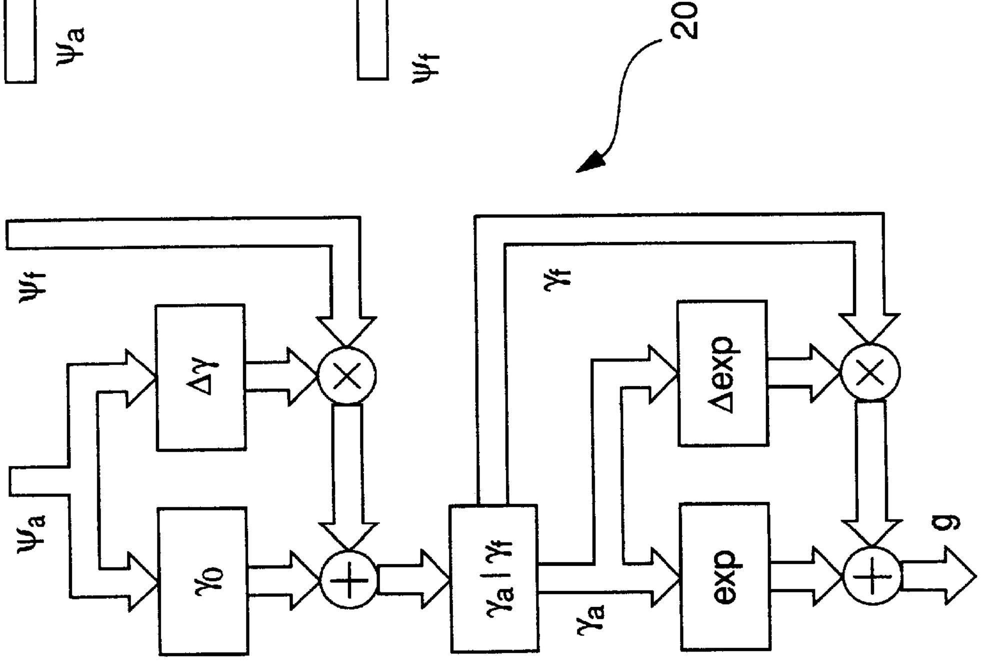

FIGS. 17 & 18 Diagrams for two-stage, linear interpolations.

Figure 20:
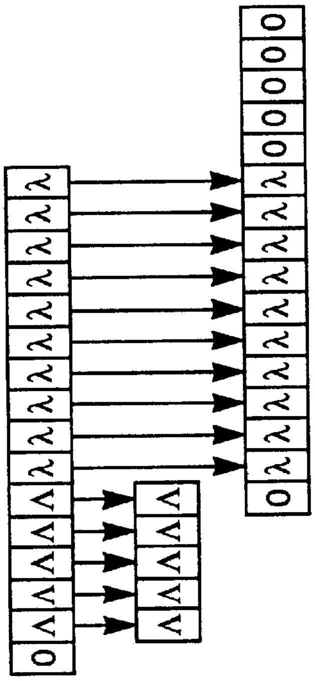
Figure 19:
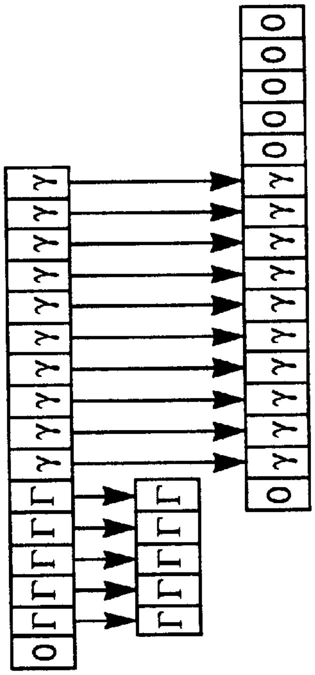

FIGS. 19 & 20 Diagrams for obtaining table addresses and proportional quantities for interpolations.

FIG. 1 illustrates the use of the method according to the invention and the actual method in a diagrammatic survey. An acoustic signal is transformed by a microphone 1 into an electric signal, which is digitized by a signal converter 2 and is then freed in a high-pass filter 3 from any offset and very low frequency interference signal components.

The essential stages of the method according to the invention consist of the processing of an output signal x of the high-pass filter 3. The iterative calculation of the control quantity ψ takes place in a processing stage 4. Thus, in a following interpolation stage 5 the parameters of a time-dependent correcting filter 7 are determined and are passed to the correcting filter 7. With regards to the filtering with the correcting filter 7, a delay stage 6 ensures the synchronization of the signal x with the filter parameter values derived from it, in that it brings about a corresponding signal delay of e.g. about 2 ms. With a sampling rate of 16 kHz, the delay stage 6 is advantageously designed as a cyclic buffer with 32 storage locations.

The signal y filtered with the correcting filter 7 passes to a signal converter 8 and is converted there into an analog electric signal. In an analog amplifier stage 9 it is amplified with a hearing impaired-specific, but time-constant gain value $g_e$ and is subsequently supplied to an electroacoustic signal transducer 10. The value of $g_e$ is determined during the preparation of the coefficient sets for the prototype filters in such a way that the 16 bit wide numerical format used in the apparatus for performing the method is used in optimum manner, a limitation of the processed signals as a result of the preceding saturation arithmetic in the apparatus only exceptionally taking place.

As stated, the loudness of complex signals can be determined as a result of the total energy of short signal segments and the centre of the short-time spectra thereof. The loudness is approximately quadratically dependent on the signal energy expressed on a logarithmic scale. As will now be shown, in the method according to the invention, the loudness model can be implemented with a bidimensional, linear interpolation. This interpolation provides more accurate results, if the control quantity $$\psi=(\sqrt{L'}-\sqrt{L_{min}})/(\sqrt{L_{max}}-\sqrt{L_{min}}) \quad (2)$$

is introduced and is approximately linearly dependent on the logarithmic signal energy. L' is the loudness limited to the value range $[L_{min}, L_{max}]$ and $L_{min}$ and $L_{max}$ are appropriately chosen minimum and maximum loudness values, which consequently describe the operating range of the method within which the correcting filter is continuously updated due to the most minor variations to the loudness. On the basis of formula (2), ψ is a control quantity normalized to a value range [0, 1] and for loudness values outside the value range [$L_{min}$, $L_{max}$] the correcting filter for ψ=0 or ψ=1 is used.

The block diagram of FIG. 2 shows in somewhat greater detail how the control quantity ψ is obtained from the input signal x. As compared with the known, segmentwise procedure, in the iterative signal processing method according to the invention in place of the signal energy of a short signal segment, there is an instantaneous signal power q and in the place of the centre of the short-time spectrum an instantaneous centre c. These quantities are determined in the processing stages 11 to 15. After a processing stage 13, corresponding output signal values $c_r$ and $q_r$, due to the iterative calculation procedure, still have an undesired dispersion, which is eliminated in the following smoothing filters 14 and 15. The smoothed signals c and q are supplied in a processing stage 16 to the aforementioned bidimensional interpolation and the successive output signal values χr also have an undesired dispersion eliminated with a following smoothing filter 17.

An essential aspect of the method according to the invention is represented by the iterative calculation procedure of the logarithmic signal power q and a centre of the short-time spectrum c expressed on a Bark scale, i.e. the implementation of formula (1) into an iterative calculation model. In place of forming frequency group-specific energies E(z), in the inventive method there is a frequency-selective weighting of the input signal x with a filter, referred to hereinafter as the frequency group filter. The frequency group filter is represented in FIG. 2 as a processing stage 11 and its output signal is designated ψ. Its transfer function $$H_{FG}(f)=\sqrt{\Delta f_G(f)}/\sqrt{\Delta f_G(f_N)} \quad (3)$$

dependent on the frequency f is obtained from the frequency group width function $\Delta f_G(f)$. The denominator in formula (3) brings about a normalization, $f_N$ being the Nyquist frequency, i.e. 8 kHz in the embodiment. Normalization aims at bringing about an optimum use of the 16 bit wide fixed-point numerical format given in the embodiment. In the embodiment the transfer function $H_{FG}(f)$ is approximated by a second order recursive filter 11. The structure of the frequency group filter 11 is illustrated in FIG. 3.

In place of the weighting of the frequency group energies E(z) with the frequency group indices z in the numerator of formula (1), in the inventive method there is a frequency-selective weighting of the signal ϕ with a filter, referred to as the Bark filter. The Bark filter is illustrated in FIG. 2 as processing stage 12 and its output signal is designated ϕ. Its transfer function $$H_B(f)=\sqrt{z(f)}/\sqrt{z(f_N)} \quad (4)$$

is obtained from the critical band rate function z(f). The denominator in formula (4) once again brings about a normalization so as to ensure an optimum use of the given numerical format. In the embodiment the transfer function $H_B(f)$ is also approximated by a second order recursive digital filter 12, which has the structure shown in FIG. 3.

With the signals v and ϕ it is possible in the inventive method to iteratively calculate the instantaneous centre of the short-time spectrum according to formula (1) and for this purpose in a processing stage 13 the quotient of its signal powers is calculated.

For the iterative calculation of signal powers, the inventive method makes use of a simple, first order estimated value calculation unit for the time exponentially weighted expected value of the squared input signal. For the general case with input signal u and output signal v, such an estimated value calculating unit is shown in FIG. 4. In this signal flow diagram a new output signal value v is obtained in that the output signal value of the preceding sampling time is multiplied with the constants (1−ε) and to this product is added the square of the new input signal value u multiplied by the constant factor ε. With the adaptation constant ε for which 0<ε<<1, the speed with which the output signal v follows the varying input signal power can be controlled.

The simple estimated value calculating unit of FIG. 4 suffers from disadvantages making it necessary for the processing of the squared input signal to use a double width numerical format and for the following calculations the logarithm of the output signal v is also required. Both these aspects are simply solved in the method according to the invention, as shown in FIG. 5, by embedding the simple estimated value calculating unit of FIG. 4 in a digital control loop.

The operation of the signal flow diagram of FIG. 5 is based on the fact that the quantity v is set to a fixed, predetermined set value. To this end, for each new calculated signal value v, the incremental, logarithmic increment or decrement quantity of the signal power is determined, which corresponds to the divergence of the value v from the given set value. The sought logarithmic signal power p is then obtained by the mere accumulation of the successive, incremental change values. For the correct operation of the control loop, it is necessary for each input signal value x to be scaled with a scaling factor matching the estimated value p and that also the quantity v is updated in multiplicative manner with a power change-corresponding adjusting value, prior to a further updating. In the inventive method, the determination of both the incremental change and also the scaling and adjusting values takes place at each sampling time for values of the quantities v and p, whose accuracy is limited by cutting off to 6 or 7 places following the decimal point. This permits an efficient use of tables, in which the 64 or 128 previously calculated, appropriate values are stored. For addressing the tables and as shown in FIGS. 6 and 7, it is merely necessary to extract the relevant bit fields from the quantities v and p. In FIG. 5 the table with the incremental, logarithmic power changes is designated Δp. In order to economic on otherwise separately performed multiplications, table S in FIG. 5 also contains modified scaling values obtained from the original scaling values by multiplication with the root from the constant ε. For the same purpose the adjusting values in table A have been multiplied with the constant (1−ε). The conventional 16 bit wide fixed point numerical format is sufficient for storing the quantities v and p, as well as for all the table values in FIG. 5.

As stated, in the inventive method, the iterative calculation of the centre of the short-time spectrum is based on the calculation of the quotient of the signal powers of signals v and ϕ, e.g. in processing stage 13. The calculation of the signal powers is led back to the signal flow diagram represented in FIG. 5. Thus, the signal flow diagram of FIG. 8 is obtained for calculating the centre of the short-time spectrum. The lower part of the diagram is identical with FIG. 5 and is used for calculating the power of signal ϕ. The upper part is used for calculating the power of signal v. In this calculation the scaling and adjusting values are taken over from the lower circuit part, so that the signal flow diagram in the upper part is simplified compared with FIG. 5. This arrangement ensures the optimum use of the numerical format for the calculation of the power of signal v and the sought centre of the short-time spectrum is obtained by quotient formation of the two signal powers.

As shown in FIG. 8, the calculation of a quotient $Q=Z/N$ formed by a numerator Z and a denominator N takes place by means of the signal power values updated with an adjusting value from table A. This has the advantage that the otherwise necessary, unfavourable division can be significantly simplified. In a numerical format normalized to a predetermined set value the denominator $$N=1+\delta \text{ with } |\delta|<<1 \tag{6}$$

assumes values only differing insignificantly from 1 and in place of the division by $(1+\delta)$ the quotient $$Q\approx Z\cdot(1-\delta) \tag{7}$$

can be approximated by multiplying the numerator Z with $(1-\delta)$.

As has already been stated, the loudness can be determined from the signal power p and the centre of the short-time spectrum c. The direct solution would consist of inserting the signal flow diagrams in FIGS. 5 and 6 and supplying their output signals, after passing through appropriate smoothing filters, to the interpolation stage 16 (cf. FIG. 2). However, the inventive method offers a further significant simplification on the basis of the fact that the frequency group filter 11 only performs a frequency-selective weighting of the input signal x. This makes it possible to so modify the entries in the original interpolation tables that for the control quantity ψ in each case the same value is obtained, if in place of the logarithmic signal power p of the input signal x use is made of the logarithmic signal power q of the signal ϕ together with the modified tables. Thus, in the method according to the invention there is no need for a separate calculation of the signal power p and the processing stage 13 of FIG. 2 merely comprises the signal flow diagram of FIG. 8.

As has already been stated, the successive signal values of the output signals of the processing stages 13 and 16 suffer from an undesired dispersion, which is eliminated with the smoothing filters 14, 15 and 17. It was obvious to use conventional, linear low-pass filters, but is completely unacceptable in the inventive method due to the associated time lags. In place thereof, use is made of a nonlinear smoothing filter according to FIG. 9 which, apart from a minimum delay time, also has a greatly reduced arithmetical expenditure. A new output value c is obtained by adding a correcting quantity D to the output value of the preceding sampling point. The correcting quantity D is determined from the difference d which results from the new input signal $c_r$ and the preceding output signal value. The quantity d is firstly multiplied by a constant factor  >1. In the smoothing filters 14, 15 and 17 the value of   is e.g. set to 2 or 3 and the result of the multiplication is limited with a saturation arithmetic to the value range [−1, 1]. The product w is then squared and limited to a value β and the correcting quanity D results from the multiplication of the thus calculated value with the quantity w.

The action of the nonlinear smoothing filter, whose signal flow diagram is shown in FIG. 9, becomes apparent from FIG. 10, which shows the connection between the internal quantities d and D. It is firstly pointed out that this smoothing filter makes use of the normalized nature of the signals to be filtered, so that their value range covers the interval [0, 1]. Therefore the difference d assumes values from the interval [−1, 1]. The imaging curve D(d) shown in FIG. 10 is formed from five different curve parts 27.1–27.5. For small absolute values of the difference d, e.g. for $-0.2<d<0.2$, the correcting quantity D is dependent on the difference d, which corresponds to a first curve part 27.1. The minor dispersions of successive signal values with values from the value range [−0.1, 0.1] are consequently efficiently suppressed. For larger absolute values of difference d, e.g. for $0.2\leqq|d|<0.5$, the imaging curve D(d) passes into linear parts corresponding to a second and third curve parts 27.2 and 27.3. In the case of significant input signal changes these parts ensure that the output signal follows with only a minimum delay. A fourth and fifth parts 27.4 and 27.5 of the imaging curve, where there is in each case a limitation to a constant value, guarantees a smooth transition, even with extreme intermittent changes of the input signal d.

With the filtered centre of the short-time spectrum c and the filtered signal power q, in processing stage 16 a calculation takes place of the control quantity x. As stated, this process takes place by bidimensional interpolation shown in a detail diagram in FIG. 11. The diagram consists of three tables. The table $\psi_o$ contains the resulting values for fixed given values of the input quantities c and q. The two other tables designated ∂ψ/∂c and ∂ψ/∂q contain the gradient values, matching the resluting values, of the function ψ (c,q) in the direction of the c and q coordinates. The value of the control quantity ψ for any input signal values c and q can be approximately obtained through $$\psi_r=\psi_0(c_i,q_k)+(c-c_i)\cdot(\partial\psi/\partial c)|_{ci,qk}+(q-q_k)\cdot(\partial\psi/\partial q)|_{ci,qk} \tag{8}$$

in which $c_i$ and $q_k$ represent the coordinates closest to c or q, which are at the same time no larger than c or q. As a result of the input quantities c and q being normalized to the value range [0, 1], in the inventive method the values $c_i$ and $q_k$, as well as $(c-c_i)$ and $(q-q_k)$ can be determined by simply masking out the bit fields as shown in FIG. 11 from the quantities c and q.

In FIG. 11, a simplified notation is used, which can be linked to the mathematical notation of equation (8) by the following definitions:

$$c = 0CCCCccccccccc \qquad q = 0QQQqqqqqqqqqqqq$$

$$c_1 = 0CCCC \qquad q_k = 0QQQ$$

$$c - c_1 = 00000cccccccc \qquad q - q_k = 0000qqqqqqqqqqqq$$

in which the upper-case letters represent those bits of the variables c and q which are used for addressing the look-up tables, and the lower-case letter represent those bits used for multiplication with the values stored in the partial derivative look-up tables. Finally, for addressing the table values, use is made of the values $c_i$ and $q_k$ combined according to FIG. 11.

Another aspect of the method according to the invention relates to the use of optimum table values in the bidimensional interpolation. The values of the function ψ(c,q) at the angles of a rectangle defined by successive coordinates are diagrammatically designated $\psi(c_i,q_k)$, $\psi(c_{i+1},q_k)$, $\psi(c_i,q_{k+1})$ and $\psi(c_{i+1},q_{k+1})$. Then, use is made in the method according to the invention of the table values $$\psi_0(c_i,q_k)=\psi(c_i,q_k)+[\psi(c_{i+1},q_k)+\psi(c_i,q_{k+1})-\psi(c_{i+1},q_{k+1})-\psi(c_i,q_k)]/4 \tag{9}$$

$$(\partial\psi/\partial c)|_{ci,qk}=\{[\psi(c_{i+1},q_{k+1})-\psi(c_i,q_{k+1})]+[\psi(c_{i+1},q_k)-\psi(c_i,q_k)]\}/2 \tag{10}$$

and $$(\partial\psi/\partial q)|_{ci,qk}=\{[\psi(c_{i+1},q_{k+1})-\psi(c_{i+1},q_k)]+[\psi(c_i,q_{k+1})-\psi(c_i,q_k)]\}/2 \quad (11)$$

Thus, the unavoidable interpolation errors are more uniformly distributed than with the close table values $\psi(c_i,q_k)$, $[\psi(c_{i+1},q_k)-\psi(c_i,q_k)]$ and $[\psi(c_i,q_{k+1})-\psi(c_i,q_k)]$. As stated, the successive signal value $\psi_r$ have an undesired dispersion, which is eliminated with the smoothing filter 17 (cf. FIG. 2). The output signal of the smoothing filter 17 is the control quantity ψ, which is used in the interpolation stage 5 (cf. FIG. 1) for determining the parameters of the correcting filter 7.

The interpolation stage 5 is shown in greater detail in the block diagram of FIG. 12. The control quantity ψ passes to a processing stage 18, where, by masking out the bit fields shown in FIG. 13, for the following interpolations are obtained from it a table address $\psi_a$ and a proportional quantity/f.

In FIG. 13, a simplified notation is used according to the following definitions:

ψ=0ΨΨΨψψψψψψψψψψψ

$\psi_a$=ΨΨΨ

$\Psi_f$=0ψψψψψψψψψψψ000. A processing stage 19 represents a three bit wide counter, whose counting value is designated j. A gain value g of the correcting filter 7 is determined in a processing stage 20 and filter coefficients $kj^{(n)}$ and $kj^{(p)}$ are determined in a processing stage 21. The counting value j and the interpolated filter parameters g, $kj^{(n)}$ and $kj^{(p)}$ are together designated m.

The counting value j and the interpolated filter parameters g, $kj^{(n)}$ and $k_j^{(p)}$ pass to the correcting filter 7 shown in greater detail in the block diagram of FIG. 14. It comprises an amplifier stage 22,a zero implementing lattice-type filter 24 and a pole implementing lattice-type filter 26. For reasons of completeness the structures of the lattice-type filters 24 and 26 are reproduced in greater detail in the signal flow diagrams of FIGS. 15 and 16.

For each sampling time an interpolated gain value g passes to the amplifier stage 22 (cf. FIG. 14) and is multiplied by the input signal $x_d$, e.g. delayed by 2 ms. The filter coefficients $k_j^{(n)}$ and $k_j^{(p)}$ pass to processing stages 23 and 25, respectively, to which is also passed the counting value j. The processing stages 23 and 25 are merely switches, which allocate the interpolated filter coefficient values, corresponding to the counting value j, to the correct filter coefficient in the lattice-type filters 24 and 26. The numerator values 0 to 7 are associated with the filter coefficients with the subscripts 1 to 8 in rising order.

The interpolation stages 20 and 21 (cf. FIG. 12) are shown in detail in FIGS. 17 and 18. As stated, the hearing correction data determined from the individual loudness details are stored in the inventive method as filter parameters in a form suitable for interpolation. For amplification this is a logarithmic gain value $$\gamma=\gamma_0(\psi_a)+\psi_f\Delta\gamma(\psi_a) \quad (12)$$

interpolated with the aid of tables $\gamma_o$ and Δγ, as shown in FIG. 17, from the input quantities $\psi_a$ and $\psi_f$. For reasons of completeness, it is pointed out that in the present case of a monodimensional interpolation there is no table Δγ and the corresponding value is in each case recalculated by the subtraction of the read out value $\gamma_o$ with respect to the following tabulated value.

For the determination of the gain value g required in amplifier stage 22, from the value γ by masking out the bit field shown in FIG. 19, the address $\gamma_a$ and proportional value $\gamma_f$ are obtained.

In FIG. 19, a simplified notation is used according to the following definitions:

γ=0ΓΓΓΓΓγγγγγγγγγγ

$\gamma_a$=ΓΓΓΓΓ

$\gamma_f$=0 γγγγγγγγγγ000. With the aid thereof, a gain value $$g=\exp(\gamma_a)+\gamma_f\Delta\exp(\gamma_a) \quad (13)$$

is obtained in a further interpolation from the tables exp and Δexp, which contain values of the exponential function. Thus, FIG. 17 is a two-stage interpolation diagram, which for the efficient determination of the necessary output value once again makes use of the normalized nature of the signal values and tables matched thereto.

In the case of the filter coefficients the hearing impaired-specific values are stored in the form of log-area-ratio coefficients. Unlike in the case of the gain value, for each sampling time only one coefficient of the two lattice-type filters 24 and 26 is redetermined. As stated, the modulo-7 counter represented by the processing stage 19 controls the selection mechanism. In the two-stage interpolation diagram of FIG. 8 the three bit wide value of the counter is combined with the quantity $\psi_a$ to the actual table address. For each of the two lattice-type filters 24 and 26 the log-area-ratio coefficient $$\lambda^{(v)}=\lambda_0^{(v)}(\psi_a,j)+\psi_f\Delta\lambda^{(v)}(\psi_a,j) \quad (14)$$

is obtained by interpolation with the tables $\lambda_0^{(v)}$ and $\Delta\lambda^{(v)}$, in which v stands for one of the symbols n or p, which differentiate the lattice-type filters 24 and 26 for zero or pole implementation.

The filter coefficients $k_j^{(n)}$ and $k_j^{(n)}$ required in the lattice-type filters 24 and 26 are determined in a new interpolation and from each of the log-area-ratio coefficients λ initially once again by masking out the bit fields shown in FIG. 20 an address value $\lambda_a$ and a proportional quantity $\lambda_f$ are obtained.

In FIG. 20, a simplified notation is used according to the following definitions:

λ=0VVVVVγγγγγγγγγγ

$\lambda_a$=VVVVV $\lambda_f$=0γγγγγγγγγγ. For the coefficients of the two lattice-type filters 24 and 26 the said process and also the subsequent interpolation can take place successively, as is intimated in FIG. 18 with the multi-plexer M and this in particular has the consequence that the tables of the hyperbolic tangent function designated tanh and Δtanh only have to be stored once. The filter coefficients $$k^{(v)}=\mathrm{tahn}(\lambda_a^{(v)})+\lambda_f^{(v)}\cdot\Delta\mathrm{tahn}(\lambda_a^{(v)}) \quad (15)$$

are obtained with a further interpolation and for efficient implementation use is again made of the normalized nature of the signal quantities and the tables matched thereto.

In summarizing, it can be stated that in the method according to the invention for the loudness-controlled processing of acoustic signals in sound processing equipment, an acoustic signal x to be processed is processed entirely in the time domain. Starting from the signal x to be processed, there is a continuous calculation of a control quantity ψ characteristic for subjective loudness reception of listeners with normal hearing. The input signal x is processed with a time-dependent filter 7, whose parameters are redetermined continuously with the aid of the control quantity ψ by the interpolation of precalculated and table-stored, user-specific correcting data and applied to the time-dependent filter 7. An apparatus according to the invention for performing the method has a processing stage 4 for the iterative calculation of the control quantity ψ and a correcting filter stage 7 controlled in time-dependent manner therewith.

What is claimed is:

1. A method of adjusting loudness of acoustic signals in a sound processing device for the benefit of a hearing-impaired person by processing entirely in the time domain, comprising the steps of:

calculating, based upon a sequence of acoustic input signals (x), a control quantity (Ψ), representing a subjective loudness perceived by listeners with normal hearing, using said control quantity to control interpolation of precalculated, table-stored, user-specific correcting data, using results of said interpolation as first input signals (m) to a time-dependent digital filter (7), delaying said acoustic input signals (x), feeding the thus-delayed acoustic signals as second input signals ($x_d$) to said time-dependent digital filter (7) and adjusting gain ($g_e$), of an amplifier (9) connected downstream of said digital filter (7) in accordance with a factor specific to said hearing-impaired person.

2. Method according to claim 1, characterized in that the acoustic signal (x) is processed iteratively without subdivision into subband signals.

3. Method according to claim 2, characterized in that the control quantity (ψ) is defined as a root of the loudness normalized to a limited loudness interval.

4. Method according to claim 3, characterized in that the control quantity (ψ) is continuously determined by a bidimensional interpolation with the aid of two iteratively calculated quantities, whereof a first iteratively calculated quantity (p) is an estimated value for the instantaneous signal power expressed on a logarithmic scale and a second iteratively calculated quantity (c) is an estimated value for the centre of the short-time spectrum of the instantaneous signal power distribution expressed on a Bark scale.

5. Method according to claim 4, characterized in that the first iteratively calculated quantity (p) is determined with the aid of an iterative, first order estimated value calculating unit, embedded in a digital control loop, for a time exponentially weighted expected value of the squared input signal.

6. Method according to claim 4, characterized in that the second iteratively calculated quantity (c) is calculated by division of an iteratively determined dividend by an iteratively determined divisor, the divisor being an estimated value for the instantaneous power of the signal (ψ) weighted with a frequency group filter and the dividend being an estimated value for the instantaneous power of the signal (v), which is also weighted with a bark filter, the transfer function of the frequency group filter corresponding to the root of a normalized frequency group width function and that of the Bark filter to the root of a normalized critical band rate function.

7. Method according to claim 6, characterized in that both the divisor and the dividend are determined with the aid of an iterative, first order estimated value calculating unit, embedded in a digital control loop, for time exponentially weighted expected value of the squared input signal, the unit for determining the divident obtaining the control signals from that of the divisor and applying them to ist signals.

8. Method according to claim 6, characterized in that the division is calculated with the aid of the controlled estimated value quantities and approximated by a multiplication with (1−δ), 1 representing the set value and $|\delta| \ll 1$.

9. Method according to claim 5, characterized in that the scaling quantities necessary for controlling the iterative estimated value calculating unit, as well as the incremental change values necessary for updating the logarithmic estimated value are read out from previously stored tables (S, A, Δp).

10. Method according to claim 9, characterized in that the reading out from the thus organized tables takes place in such a way that the table subscripts for finding the sought quantities are obtained by merely masking out bit fields from the as yet unregulated estimated value quantity (v) and the logarithmic estimated value quantity (p).

11. Method according to claim 1, characterized in that control quantity (ψ) is continuously determined by a bidimensional interpolation with the aid of two iteratively calculated quantities, whereof a first iteratively calcualted quantity (q) is an estimated value, expressed on a logarithmic scale, for the instantaneous power of a signal (ψ) weighted with a frequency group filter, the weighting being compensated by modifying the entries in the original interpolation table, and a second iteratively calculated quantity (c) is an estimated value, expressed on a Bark scale, for the centre of the short-time spectrum of the instantaneous signal power distribution.

12. Method according to claim 11, characterized in that the control quantity (ψ) and/or the first iteratively calculated quantity (p or q) and/or the second iteratively calculated quantity (c) are smoothed with a nonlinear filter in such a way that a new output value is obtained by the addition of a correcting value (D) to the preceding starting value, that said correcting value (D) is calculated from the difference (d) between the new input signal and the preceding output signal and that the correcting value (D) for small absolute values (|d|) of the difference (d) is dependent on the cube of the difference (d), for medium absolute values (|d|) of the difference (d) is dependent linearly on this difference (d) and for large absolute values (|d|) of the difference (d) is constant.

13. Method according to claim 12, characterized in that the interpolation of the control quantity (ψ) takes place with tables organized in such a way that both the table index for finding the resulting value and the incremental increment quantities in both dimensions and also the proportional quantities with which the incremental increment values are multiplied by the addition to the resulting value can be obtained by simple masking out of bit fields from the iteratively calculated quantities (p or q; c).

14. Method according to claim 13, characterized in that in the tables for the bidimensional interpolation of the control quantity (ψ), use is made of optimized values according to the formulas $$\psi_0(c_i,q_k)=\psi(c_i,q_k)+[\psi(c_{i+1},q_k)+\psi(c_i,q_{k+1})-\psi(c_{i+1},q_{k+1})-\psi(c_i,q_k)]/4 \tag{9}$$

$$(\partial\psi/\partial c)|_{ci,qk}=\{[\psi(c_{i+1},q_{k+1})-\psi(c_i,q_{k+1})]+[\psi(c_{i+1},q_k)-\psi(c_i,q_k)]\}/2 \tag{10}$$

and $$(\partial\psi/\partial q)|_{ci,qk}=\{[\psi(c_{i+1},q_{k+1})-\psi(c_{i+1},q_k)]+[\psi(c_i,q_{k+1})-\psi(c_i,q_k)]\}/2 \tag{11}$$

15. Method according to claim 1, characterized in that for the interpolation of the user-specific correcting data table-stored values are filed as amplification values in the logarithmic domain and as filter coefficients in the log-area-ratio domain.

16. Method according to claim 15, characterized in that the interpolation of the user-specific correcting data takes place with tables organized in such a way that the table index for finding the resulting value and the table index for finding the proportional quantity is multiplied by the difference between the following resulting value and the actual resulting value prior to the addition to the resulting value, by simple masking out of bit fields from the control quantity ($\psi$).

17. Method according to claim 16, characterized in that the gain value is obtained from the interpolated logarithmic gain value and the filter coefficients from the interpolated log-area-ratio coefficients by interpolation with stored tables of the exponential function and hyperbolic tangent function, as well as tables of the incremental increment quantities of these functions.

18. Method according to claim 17, characterized in that interpolation takes place with tables organized in such a way that the table indices for finding the resulting values and the incremental increment quantities, as well as the proportional quantities with which the incremental increment quantities are multiplied prior to the addition to the resulting values, are obtained by the simple masking out of bit fields from the interpolated gain value and the interpolated log-area-ration coefficients.

19. Method according to claim 18, characterized in that redetermination takes place for the gain value in each sampling interval and, from the filter coefficients in each sampling interval, only for the coefficients of a pole/zero pair, applying a fixed, uniform sequence for redetermining the filter coefficients.

20. Method according to claim 19, characterized in that the input signal to the aforementioned time-dependent filter is so delayed that the filter coefficients and gain values always to be redetermined via the calculation of said quantity ($\psi$) are applied on time to the signal forming a basis for the calculation.

21. An apparatus for performing real-time loudness adjustment of a sequence of time-varying acoustic input signals (x) by processing entirely in the time domain, comprising a time-dependent digital filter (7) having first and second inputs, a processing stage (4) for iterative calculation of a control quantity ($\Psi$), representing a subjective loudness perceived by listeners with normal hearing, and for interpolating, using said control quantity ($\Psi$), precalculated, table-stored, user-specific correcting data, and for feeding results (m) of said interpolation to said first input of said time-dependent digital filter and for controlling, in time-dependent manner, said time-dependent digital filter with said control quantity, and a delay unit (6) for delaying said acoustic input signals (x) and feeding said delayed acoustic input signals ($x_d$) to said second input of said time-dependent digital filter.

22. Apparatus according to claim 21, further comprising a bidimensional interpolation stage (16) for determining the control quantity ($\psi$) from a signal power (q) and from a center of the short-time spectrum (c) of the acoustic input signals (x).

23. Apparatus according to claim 22, characterized by a frequency group filter (11) and Bark filter (12) for determining filtered signals ($\phi$,v) from an input signal (x).

24. Apparatus according to claim 23, characterized in that the frequency group filter and Bark filter are designed as recursive filters.

25. Apparatus according to claim 24, characterized by an estimated value calculating unit (13) for calculating the signal power (q) and centre of the short-time spectrum (c) from the filtered input signals ($\phi$,v).

26. Apparatus according to claim 25, characterized by smoothing filters (14, 15, 17) for eliminating undesired dispersion of successive signal values ($c_r$, $q_r$, $\psi_r$).

27. Apparatus according to claim 26, characterized by a serial connection of an amplifier stage (22), a zero-implementing lattice-type filter stage (24) and a pole-implementing lattice-type filter stage (26).

28. Apparatus according to claim 27, characterized by two-stage interpolation stages for determining the gain value (g) and the coefficients ($k_j^{(n)}$ and $k_j^{(p)}$) of the correcting filter (7) from the control quantity ($\psi$).

29. Apparatus according to claim 28, characterized by a signal delay unit (6) for the synchronizing of the input signal (x) with respect to the processing with the correcting filter (7), whose filter parameters are derived from the input signal (x).

* * * * *